(12) United States Patent
Lee et al.

(10) Patent No.: US 11,264,446 B2
(45) Date of Patent: Mar. 1, 2022

(54) DISPLAY APPARATUS AND METHOD OF DRIVING THE SAME

(71) Applicant: Samsung Display Co., Ltd., Yongin-si (KR)

(72) Inventors: Hyo Jin Lee, Yongin-si (KR); Jinyoung Roh, Hwaseong-si (KR); Sehyuk Park, Seongnam-si (KR); Sangan Kwon, Cheonan-si (KR); Hui Nam, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/843,637

(22) Filed: Apr. 8, 2020

(65) Prior Publication Data

US 2020/0350389 A1 Nov. 5, 2020

(30) Foreign Application Priority Data

May 2, 2019 (KR) ........................ 10-2019-0051610

(51) Int. Cl.
*G09G 3/3291* (2016.01)
*G09G 5/18* (2006.01)
(Continued)

(52) U.S. Cl.
CPC ........ *H01L 27/3276* (2013.01); *G06F 1/3262* (2013.01); *G06F 3/041* (2013.01);
(Continued)

(58) Field of Classification Search
CPC ........ G06F 3/0412; G06F 3/041; G06F 3/044; G06F 3/0416; G06F 3/04186; G06F 3/04166; G06F 1/3265; G06F 1/3262; G06F 2203/0416; G09G 3/3648; G09G 3/3611; G09G 3/2092; G09G 3/20; G09G 3/2096; G09G 3/3092; G09G 2310/08; G09G 2310/0213; G09G 2310/0291; G09G 2340/0435; G09G 2370/08;
(Continued)

(56) References Cited

U.S. PATENT DOCUMENTS 9,583,036 B2 * 2/2017 Lee .......................... G09G 3/20
9,710,049 B2 * 7/2017 Takashimizu ......... G06F 1/3265
(Continued)

FOREIGN PATENT DOCUMENTS

KR 10-2016-0017250 A 2/2016
KR 10-2017-0051730 A 5/2017

*Primary Examiner* — Dismery Mercedes
(74) *Attorney, Agent, or Firm* — Lewis Roca Rothgerber Christie LLP

(57) ABSTRACT

A display apparatus includes: a display panel configured to display an image based on input image data; a gate driver configured to output a gate signal to the display panel; a data driver configured to output a data voltage to the display panel; a driving controller configured to control an operation of the gate driver and an operation of the data driver, to determine a normal driving mode and a low frequency driving mode based on the input image data, and to determine a driving frequency of the display panel based on the input image data; and a touch driver configured to detect a touch event occurring on the display panel, and to output a touch interrupt signal representing the touch event to the driving controller.

16 Claims, 12 Drawing Sheets

(51) Int. Cl.
*G06F 3/041* (2006.01)
*G06F 1/3234* (2019.01)
*G09G 3/36* (2006.01)
*H01L 27/32* (2006.01)
*G09G 3/20* (2006.01)

(52) U.S. Cl.
CPC ........ *G06F 3/0412* (2013.01); *G06F 3/04166* (2019.05); *G06F 3/04186* (2019.05); *G09G 3/20* (2013.01); *G09G 3/3291* (2013.01); *G09G 3/3648* (2013.01); *G09G 5/18* (2013.01); *H01L 27/323* (2013.01); *G09G 2310/027* (2013.01); *G09G 2310/08* (2013.01); *G09G 2330/021* (2013.01)

(58) Field of Classification Search
CPC ........ G09G 2320/103; G09G 2360/18; G09G 5/18; G09G 2330/021; G02F 1/13338; H01L 27/323
See application file for complete search history.

(56) References Cited

U.S. PATENT DOCUMENTS

| | | | |
|---|---|---|---|
| 9,842,536 B2* | 12/2017 | Choi | G09G 3/3275 |
| 9,875,681 B2 | 1/2018 | Lee et al. | |
| 9,910,533 B2 | 3/2018 | Agarwal et al. | |
| 10,324,567 B2* | 6/2019 | Cho | G06F 3/04166 |
| 10,565,963 B2* | 2/2020 | Kim | G09G 3/2096 |
| 10,739,884 B2* | 8/2020 | Ota | G09G 3/3648 |
| 2012/0113031 A1* | 5/2012 | Lee | G06F 3/04166 |
| | | | 345/173 |
| 2013/0290761 A1* | 10/2013 | Moon | G06F 1/32 |
| | | | 713/323 |
| 2014/0340317 A1* | 11/2014 | Rodzeveski | G06F 3/048 |
| | | | 345/173 |
| 2015/0185931 A1* | 7/2015 | Hwang | G06F 11/3485 |
| | | | 345/173 |
| 2015/0340014 A1* | 11/2015 | Kim | G09G 5/10 |
| | | | 345/212 |
| 2017/0018234 A1* | 1/2017 | Na | G09G 3/3406 |
| 2017/0053592 A1 | 2/2017 | Shin et al. | |
| 2017/0092178 A1* | 3/2017 | Lee | G09G 3/2018 |
| 2017/0153736 A1* | 6/2017 | Kim | G06F 3/0443 |
| 2018/0040301 A1 | 2/2018 | Bae et al. | |
| 2018/0188832 A1* | 7/2018 | Coppin | G06F 3/04162 |
| 2020/0357334 A1* | 11/2020 | Li | G02F 1/1333 |

\* cited by examiner

FIG. 3

| GRAYSCALE VALUE | FLICKER LUT | DRIVING FREQUENCY |
|---|---|---|
| 0 | 0 | 1Hz |
| 1 | 0 | 1Hz |
| 2 | 0 | 1Hz |
| ... | ... | ... |
| 15 | 1 | 30Hz |
| 16 | 1 | 30Hz |
| 17 | 1 | 30Hz |
| 18 | 2 | 10Hz |
| 19 | 2 | 10Hz |
| 20 | 2 | 10Hz |
| 21 | 2 | 10Hz |
| 22 | 2 | 10Hz |
| 23 | 3 | 5Hz |
| 24 | 3 | 5Hz |
| 25 | 3 | 5Hz |
| 26 | 3 | 5Hz |
| 27 | 3 | 5Hz |
| ... | ... | ... |
| 254 | 0 | 1Hz |
| 255 | 0 | 1Hz |

DISPLAY APPARATUS AND METHOD OF DRIVING THE SAME

CROSS-REFERENCE TO RELATED APPLICATION

The present application claims priority to and the benefit of Korean Patent Application No. 10-2019-0051610, filed on May 2, 2019 in the Korean Intellectual Property Office KIPO, the content of which is incorporated herein by reference in its entirety.

BACKGROUND

1. Field

Aspects of some example embodiments of the present inventive concept relate to a display apparatus and a method of driving the display apparatus.

2. Description of the Related Art

A display apparatus may include a display panel and a display panel driver. The display panel includes a plurality of gate lines, a plurality of data lines and a plurality of pixels. The display panel driver includes a gate driver, a data driver, and a driving controller. The gate driver outputs gate signals to the gate lines. The data driver outputs data voltages to the data lines. The driving controller controls the gate driver and the data driver.

The driving controller may determine a driving frequency of the display panel according to input image data. When an event generated at the display apparatus is not transmitted to the driving controller fast in a low frequency driving mode, an image transmission may be delayed. For example, when a touch event of the display panel is generated in the low frequency driving mode, an immediate image transmission may be required. When the delay of the touch event occurs in 1 Hz driving, the image transition may be delayed (e.g., for about a second) so that a user may perceive the image transition as a display defect.

The above information disclosed in this Background section is only for enhancement of understanding of the background and therefore the information discussed in this Background section does not necessarily constitute prior art.

SUMMARY

Aspects of some example embodiments of the present inventive concept relate to a display apparatus and a method of driving the display apparatus. For example, some example embodiments of the present inventive concept relate to a display apparatus determining a touch event fast in a low frequency driving method to prevent or reduce a delay of an image transition and a method of driving the display apparatus.

Aspects of some example embodiments of the present inventive concept include a display apparatus that may be capable of preventing or reducing a delay of an image transition, when a touch event is generated, to enhance a display quality.

Aspects of some example embodiments of the present inventive concept may also include a method of driving the above-mentioned display apparatus.

According to some example embodiments of the present inventive concept, a display apparatus includes a display panel, a gate driver, a data driver, a driving controller and a touch driver. The display panel is configured to display an image based on input image data. The gate driver is configured to output a gate signal to the display panel. The data driver is configured to output a data voltage to the display panel. The driving controller is configured to control an operation of the gate driver and an operation of the data driver, to determine a normal driving mode and a low frequency driving mode based on the input image data, and to determine a driving frequency of the display panel based on the input image data. The touch driver is configured to detect a touch event occurred on the display panel, and to output a touch interrupt signal representing the touch event to the driving controller.

According to some example embodiments, the driving controller may be configured to perceive the touch event by the touch interrupt signal. When the display panel is driven in the low frequency driving mode and the driving controller perceives the touch event, the driving controller may be configured to drive the display panel in the normal driving mode in a right next frame of a frame when the touch event is perceived.

According to some example embodiments, the driving controller may include a still image determiner configured to determine whether the input image data is a still image or a video image, and to generate a flag representing whether the input image data is the still image or the video image and a driving frequency determiner configured to determine the normal driving mode and the low frequency driving mode based on the flag and to determine the driving frequency of the display panel based on a grayscale value of the input image data.

According to some example embodiments, the driving controller may further include a flicker lookup table representing a degree of a flicker according to the grayscale value of the input image data. The driving frequency determiner may be configured to determine the driving frequency of the display panel using the flicker lookup table.

According to some example embodiments, the driving controller may include an input port configured to receive the touch interrupt signal from the touch driver.

According to some example embodiments, the touch driver may be configured to generate a touch coordinate signal representing a touch position. The display apparatus may further include a host configured to output the input image data to the driving controller and to receive the touch interrupt signal and the touch coordinate signal from the touch driver.

According to some example embodiments, the touch driver may be configured to output the touch interrupt signal to the driving controller after a predetermined time delay.

According to some example embodiments, the display panel may include a switching element of a first type and a switching element of a second type different from the first type.

According to some example embodiments, the driving controller may be configured to determine a driving frequency of the switching element of the first type to a first driving frequency and a driving frequency of the switching element of the second type to a second driving frequency less than the first driving frequency in the low frequency driving mode. The driving controller may be configured to determine the driving frequency of the switching element of the first type to the first driving frequency and the driving frequency of the switching element of the second type to the first driving frequency in the normal driving mode.

According to some example embodiments, the switching element of the first type may be a polysilicon thin film transistor. The switching element of the second type may be an oxide thin film transistor.

According to some example embodiments, the switching element of the first type may be a P-type transistor. The switching element of the second type may be an N-type transistor.

According to some example embodiments of the present inventive concept, a display apparatus includes a display panel, a gate driver, a data driver, a driving controller and a button controller. The display panel is configured to display an image based on input image data. The gate driver is configured to output a gate signal to the display panel. The data driver is configured to output a data voltage to the display panel. The driving controller is configured to control an operation of the gate driver and an operation of the data driver, to determine a normal driving mode and a low frequency driving mode based on the input image data, and to determine a driving frequency of the display panel based on the input image data. The button controller is configured to detect a button input event occurred at an input button, and to output a button interrupt signal representing the button input event to the driving controller.

According to some example embodiments, the driving controller may be configured to perceive the button input event by the button interrupt signal. When the display panel is driven in the low frequency driving mode and the driving controller perceives the button input event, the driving controller may be configured to drive the display panel in the normal driving mode in a right next frame of a frame when the button input event is perceived.

According to some example embodiments, the display apparatus may further include a host configured to output the input image data to the driving controller and to receive the button interrupt signal from the button controller.

According to some example embodiments of the present inventive concept, in a method of driving a display apparatus, the method includes determining a normal driving mode and a low frequency driving mode based on input image data using a driving controller, determining a driving frequency of a display panel based on the input image data using the driving controller, outputting a gate signal to the display panel, outputting a data voltage to the display panel and detecting a touch event occurred on the display panel and outputting a touch interrupt signal representing the touch event to the driving controller.

According to some example embodiments, the driving controller may be configured to perceive the touch event by the touch interrupt signal. When the display panel is driven in the low frequency driving mode and the driving controller perceives the touch event, the driving controller may be configured to drive the display panel in the normal driving mode in a right next frame of a frame when the touch event is perceived.

According to some example embodiments, the normal driving mode and the low frequency driving mode may include determining whether the input image data is a still image or a video image, generating a flag representing whether the input image data is the still image or the video image and determining the normal driving mode and the low frequency driving mode based on the flag.

According to some example embodiments, the driving frequency of the display panel may be determined based on a grayscale value of the input image data. The driving frequency of the display panel may be determined using a flicker lookup table representing a degree of a flicker according to the grayscale value of the input image data.

According to some example embodiments, the touch interrupt signal may be outputted to the driving controller after a predetermined time delay.

According to some example embodiments, the display panel may include a switching element of a first type and a switching element of a second type different from the first type. The driving controller may be configured to determine a driving frequency of the switching element of the first type to a first driving frequency and a driving frequency of the switching element of the second type to a second driving frequency less than the first driving frequency in the low frequency driving mode. The driving controller may be configured to determine the driving frequency of the switching element of the first type to the first driving frequency and the driving frequency of the switching element of the second type to the first driving frequency in the normal driving mode.

According to some example embodiments, in a display apparatus and the method of driving the display apparatus, the touch driver may directly output a touch interrupt signal representing an occurrence of a touch event to the driving controller so that the driving controller may determine the touch event fast. In addition, the button controller may directly output a button interrupt signal representing a button input event to the driving controller so that the driving controller may determine the button input event fast.

According to some example embodiments, the driving controller may determine the touch event and the button input event fast so that the display defect due to the delay of the image transition in the low frequency driving mode may be prevented or reduced. Therefore, the display quality of the display panel may be enhanced.

BRIEF DESCRIPTION OF THE DRAWINGS

The above and other features and aspects of the present inventive concept will become more apparent by describing in detail aspects of some example embodiments thereof with reference to the accompanying drawings, in which:

FIG. 3 is a table illustrating an example flicker lookup table of FIG. 2;

DETAILED DESCRIPTION

Hereinafter, aspects of some example embodiments of the present inventive concept will be explained in more detail with reference to the accompanying drawings.

Figure 1:
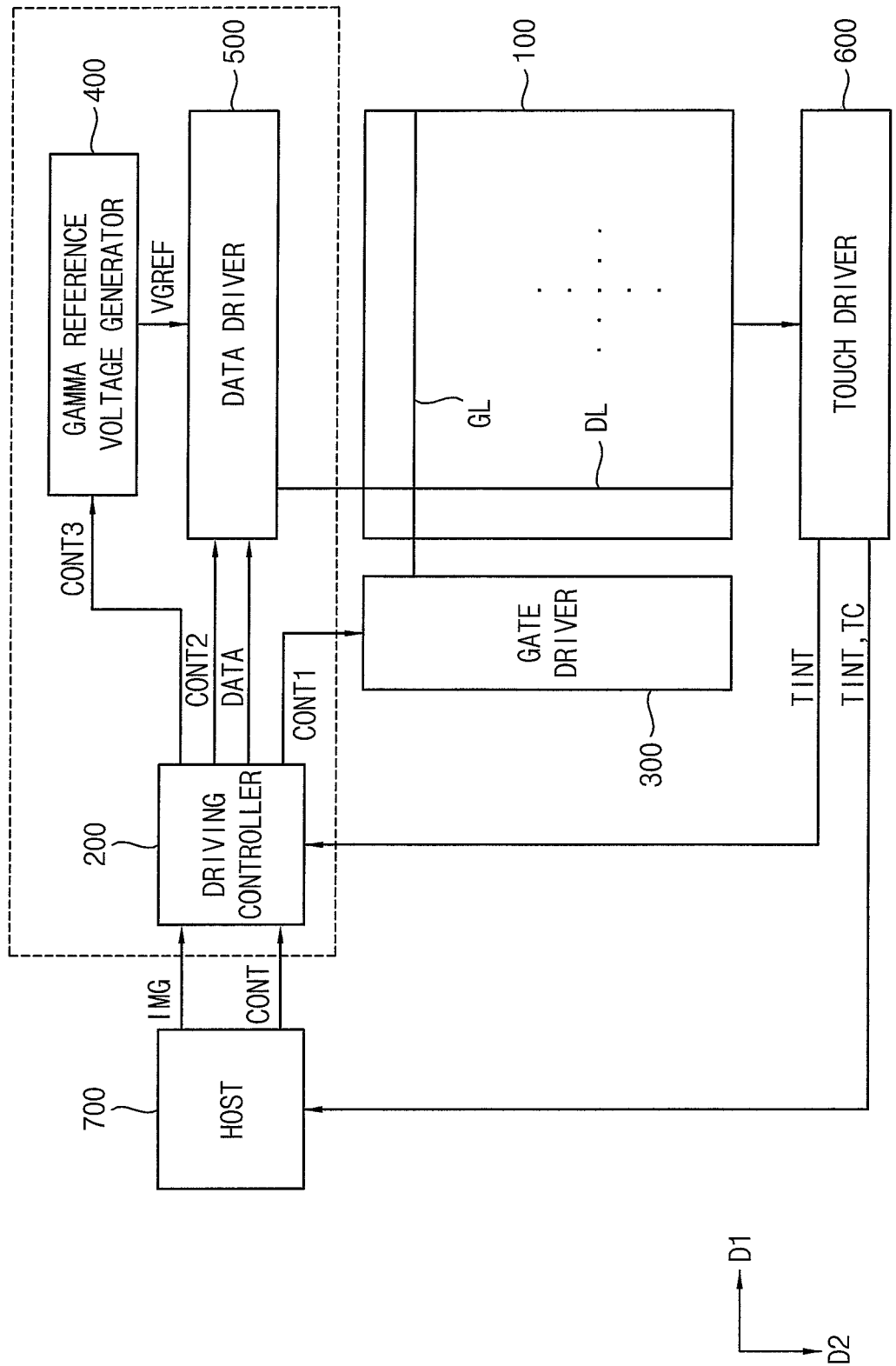
FIG. 1 is a block diagram illustrating a display apparatus according to some example embodiments of the present inventive concept.

FIG. 1 is a block diagram illustrating a display apparatus according to some example embodiments of the present inventive concept.

Referring to FIG. 1, the display apparatus includes a display panel 100 and a display panel driver. The display panel driver includes a driving controller 200, a gate driver 300, a gamma reference voltage generator 400 and a data driver 500. The display apparatus may further include a touch driver 600. The display apparatus may further include a host 700.

For example, the driving controller 200 and the data driver 500 may be integrally formed. For example, the driving controller 200, the gamma reference voltage generator 400 and the data driver 500 may be integrally formed. A driving module including at least the driving controller 200 and the data driver 500 may be referred to a timing controller embedded data driver (TED).

The display panel 100 includes a display region and a peripheral region adjacent to the display region.

For example, the display panel 100 may be an organic light emitting diode display panel including organic light emitting diodes. Alternatively, the display panel 100 may be a liquid crystal display panel including liquid crystal molecules.

The display panel 100 includes a plurality of gate lines GL, a plurality of data lines DL, and a plurality of pixels electrically connected to the gate lines GL and the data lines DL. The gate lines GL extend in a first direction D1 and the data lines DL extend in a second direction D2 crossing the first direction D1.

According to some example embodiments, the display panel 100 may be a touch screen panel perceiving a touch event.

The driving controller 200 receives input image data IMG and an input control signal CONT from the host 700. The input image data IMG may include red image data, green image data and blue image data. The input image data IMG may include white image data. The input image data IMG may include magenta image data, yellow image data and cyan image data. The input control signal CONT may include a master clock signal and a data enable signal. The input control signal CONT may further include a vertical synchronizing signal and a horizontal synchronizing signal.

The driving controller 200 generates a first control signal CONT1, a second control signal CONT2, a third control signal CONT3 and a data signal DATA based on the input image data IMG and the input control signal CONT.

The driving controller 200 generates the first control signal CONT1 for controlling an operation of the gate driver 300 based on the input control signal CONT, and outputs the first control signal CONT1 to the gate driver 300. The first control signal CONT1 may include a vertical start signal and a gate clock signal.

The driving controller 200 generates the second control signal CONT2 for controlling an operation of the data driver 500 based on the input control signal CONT, and outputs the second control signal CONT2 to the data driver 500. The second control signal CONT2 may include a horizontal start signal and a load signal.

The driving controller 200 generates the data signal DATA based on the input image data IMG. The driving controller 200 outputs the data signal DATA to the data driver 500. According to some example embodiments, the driving controller 200 may compensate the input image data IMG to generate the data signal DATA.

The driving controller 200 generates the third control signal CONT3 for controlling an operation of the gamma reference voltage generator 400 based on the input control signal CONT, and outputs the third control signal CONT3 to the gamma reference voltage generator 400.

The gate driver 300 generates gate signals driving the gate lines GL in response to the first control signal CONT1 received from the driving controller 200. The gate driver 300 outputs the gate signals to the gate lines GL. For example, the gate driver 300 may sequentially output the gate signals to the gate lines GL. For example, the gate driver 300 may be mounted on the display panel 100. For example, the gate driver 300 may be integrated on the display panel 100.

The gamma reference voltage generator 400 generates a gamma reference voltage VGREF in response to the third control signal CONT3 received from the driving controller 200. The gamma reference voltage generator 400 provides the gamma reference voltage VGREF to the data driver 500. The gamma reference voltage VGREF has a value corresponding to a level of the data signal DATA.

According to some example embodiments, the gamma reference voltage generator 400 may be located in the driving controller 200, or in the data driver 500.

The data driver 500 receives the second control signal CONT2 and the data signal DATA from the driving controller 200, and receives the gamma reference voltages VGREF from the gamma reference voltage generator 400. The data driver 500 converts the data signal DATA into data voltages having an analog type using the gamma reference voltages VGREF. The data driver 500 outputs the data voltages to the data lines DL.

The touch driver 600 may determine a touch event of the display panel 100. The touch driver 600 may generate a touch interrupt signal TINT representing an occurrence of the touch event and a touch coordinate signal TC representing coordinates of a touch position. The touch driver 600 may output the touch interrupt signal TINT and the touch coordinate signal TC to the host 700. In addition, the touch driver 600 may output the touch interrupt signal TINT to the driving controller 200. Thus, according to some example embodiments, the driving controller 200 may include an input port receiving the touch interrupt signal TINT from the touch driver 600.

The host 700 outputs the input image data IMG and the input control signal CONT to the driving controller 200.

The host 700 may receive the touch interrupt signal TINT and the touch coordinate signal TC from the touch driver 600. The host 700 may change the input image data IMG to change a display image of the display panel 100 in response to the touch interrupt signal TINT and the touch coordinate signal TC.

Figure 2:
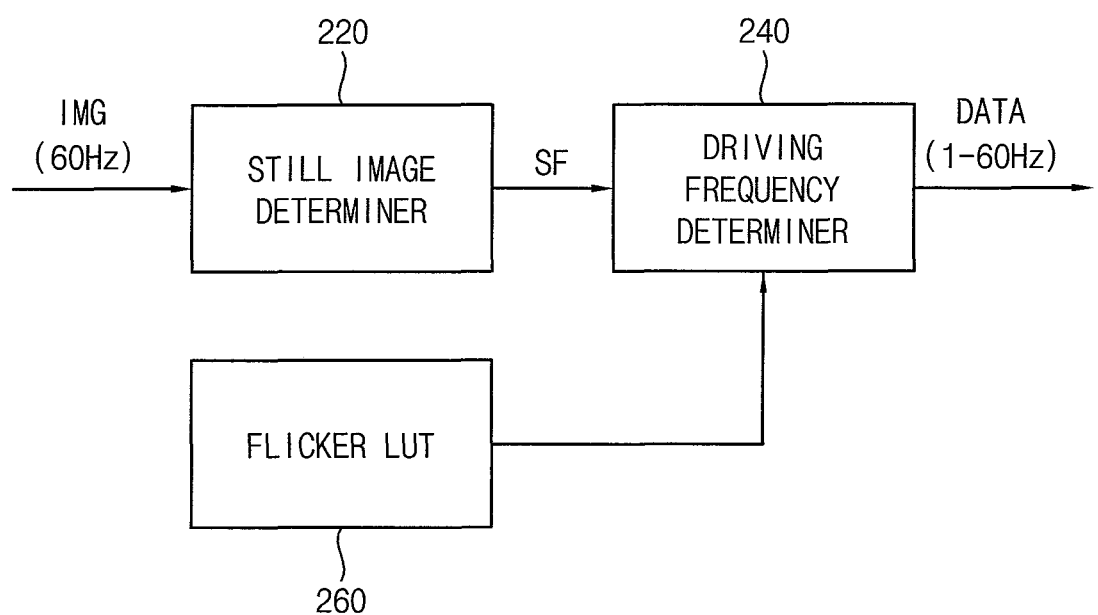
FIG. 2 is a block diagram illustrating a driving controller of FIG. 1.

FIG. 2 is a block diagram illustrating the driving controller 200 of FIG. 1. FIG. 3 is a table illustrating an example flicker lookup table of FIG. 2.

Referring to FIGS. 1 to 3, the display panel 100 may be driven in a normal driving mode and a low frequency driving mode. In the normal driving mode, the display panel 100 may be driven in a normal driving frequency. In the low frequency driving mode, the display panel 100 may be driven in a driving frequency less than the normal driving frequency.

For example, when the input image data represent a video image, the display panel 100 may be driven in the normal driving mode. For example, when the input image data represent a still image, the display panel may be driven in the low frequency driving mode. For example, when the display apparatus is operated in the always on mode, the display panel may be driven in the low frequency driving mode.

The driving controller 200 may include a still image determiner 220, a driving frequency determiner 240 and a flicker lookup table 260.

The still image determiner 220 may determine whether the input image data IMG is a still image or a video image. The still image determiner 220 may output a flag SF representing whether the input image data IMG is the still image or the video image to the driving frequency determiner 240. For example, when the input image data IMG is the still image, the still image determiner 220 may output the flag SF of 1 to the driving frequency determiner 240. When the input image data IMG is the video image, the still image determiner 220 may output the flag SF of 0 to the driving frequency determiner 240. When the display panel 100 is operated in always on mode, the still image determiner 220 may output the flag SF of 1 to the driving frequency determiner 240.

When the flag SF is 1, the driving frequency determiner 240 may drive the display panel 100 in the low frequency driving mode. When the flag SF is 0, the driving frequency determiner 240 may drive the display panel 100 in the normal driving mode.

The driving frequency determiner 240 may refer the flicker lookup table 260 to determine a low driving frequency. The flicker lookup table 260 may include a flicker value according to a grayscale value of the input image data IMG. For example, the flicker lookup table 260 may store a minimum driving frequency in a condition that the difference of the luminance of the writing frame and the luminance of the holding frame does not exceed a just noticeable difference for the grayscale value of the input image data.

In FIG. 3, the flicker lookup table may have a value of 0 for the grayscale values of 0, 1 and 2. Herein the value of 0 of the flicker lookup table may represent the driving frequency of 1 Hz. In FIG. 3, the flicker lookup table may have a value of 1 for the grayscale values of 15, 16 and 17. Herein the value of 1 of the flicker lookup table may represent the driving frequency of 30 Hz. In FIG. 3, the flicker lookup table may have a value of 2 for the grayscale values of 18 to 22. Herein the value of 2 of the flicker lookup table may represent the driving frequency of 10 Hz. In FIG. 3, the flicker lookup table may have a value of 3 for the grayscale values of 23 to 27. Herein the value of 3 of the flicker lookup table may represent the driving frequency of 5 Hz. In FIG. 3, the flicker lookup table may have a value of 0 for the grayscale values of 254 to 255.

Figure 4:
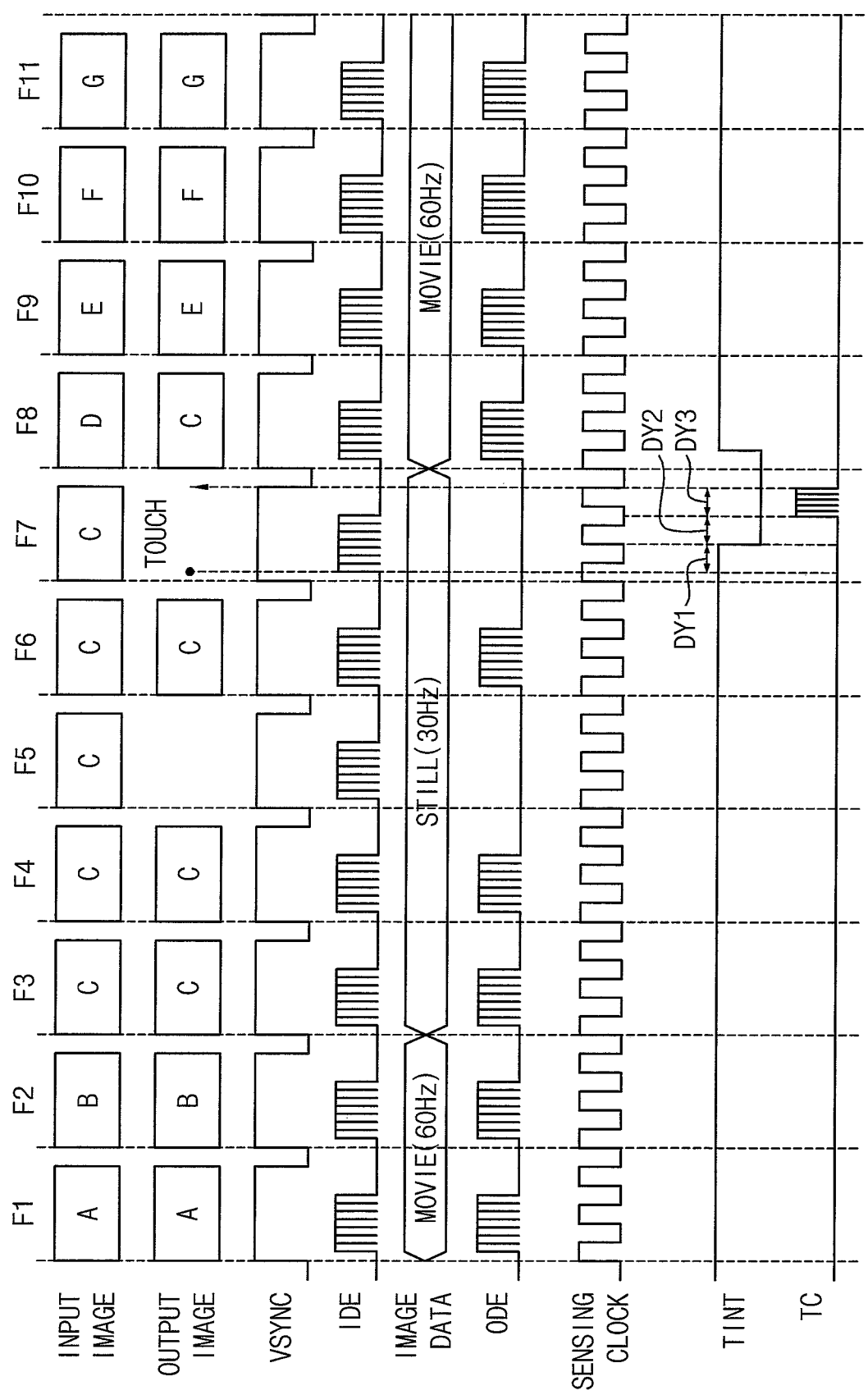
FIG. 4 is a timing diagram illustrating input and output signals of a display apparatus according to a comparative embodiment.

FIG. 4 is a timing diagram illustrating input and output signals of a display apparatus according to a comparative embodiment;

Referring to FIGS. 1 to 4, the driving controller 200 may generate the data signal DATA (OUTPUT IMAGE) based on the input image data IMG (INPUT IMAGE).

The input image data IMG (INPUT IMAGE) may include input frame images. The data signal DATA (OUTPUT IMAGE) may include output frame images.

A frame may be defined by a vertical synchronizing signal VSYNC. In FIG. 4, the frame is defined by a time duration between adjacent rising edges of the vertical synchronizing signal VSYNC.

When an input data enable signal IDE has an active level, the input image data INPUT IMAGE may be inputted. When an output data enable signal ODE has an active level, the data signal OUTPUT IMAGE may be outputted.

The input data enable signal IDE may be activated in all of the frames in FIG. 4. In contrast, the output data enable signal ODE may be activated in not all of the frames in FIG. 4. The output data enable signal ODE may be activated in a writing frame of the low frequency driving mode and inactivated in a holding frame of the low frequency driving mode.

The input image data INPUT IMAGE during first to third frames F1 to F3 may be respectively A, B and C. The input image data INPUT IMAGE during the first to third frames F1 to F3 are different from one another so that the driving controller 200 may determine the input image data INPUT IMAGE during the first to third frames F1 to F3 as the movie image. Thus, during the first to third frames F1 to F3, the data signal OUTPUT IMAGE is driven in a relatively high frequency (e.g. 60 Hz).

The input image data INPUT IMAGE of a fourth frame F4 is same as the input image data INPUT IMAGE of the third frame F3 so that the driving controller 200 may determine the input image data INPUT IMAGE of the fourth frame F4 as the still image.

The input image data INPUT IMAGE during fifth to seventh frames F5 to F7 are same as the input image data INPUT IMAGE of the fourth frame F4 so that the driving controller 200 may determine the input image data INPUT IMAGE during the fifth to seventh frames F5 to F7 as the still image.

When the input image data (INPUT IMAGE) represent the movie image, the display panel 100 is driven in the normal driving mode. When the input image data INPUT IMAGE represent the still image, the display panel 100 is driven in the low frequency driving mode.

According to some example embodiments, the driving frequency (e.g. 30 Hz) in the low frequency driving mode may be half of the driving frequency (e.g. 60 Hz) in the normal driving mode. Thus, the writing frame and the holding frame may be alternately arranged in the low frequency driving mode.

In FIG. 4, a touch event occurs on the display panel 100 in the seventh frame F7. A sensing clock signal SENSING CLOCK is a signal for sensing the touch event. A frequency of the sensing clock signal SENSING CLOCK may be different from a frequency of the vertical synchronizing signal VSYNC. In FIG. 4, for example, the frequency of the sensing clock signal SENSING CLOCK may be greater than the frequency of the vertical synchronizing signal VSYNC by three times.

When the touch event occurs on the display panel 100, the touch driver 600 detects the touch event. When the touch event occurs, a related-art touch driver may output the touch interrupt signal TINT and the touch coordinate signal TC to the host 700.

The host 700 may change the input image data INPUT IMAGE to respond the touch event. The host 700 may change the input image data INPUT IMAGE based on the touch interrupt signal TINT and the touch coordinate signal TC and output the input image data INPUT IMAGE to the driving controller 200.

A first delay DY1 may be generated from a time point of detecting the touch event to a time point of generating the touch interrupt signal TINT. A second delay DY2 may be generated from the time point of generating the touch interrupt signal TINT to a time point of generating the touch coordinate signal TC. A third delay DY3 may be generated from the time point of generating the touch coordinate signal TC to a time point of completely transmitting the touch coordinate signal TC to the host 700.

In a related-art display apparatus, the driving controller 200 may receive the touch event from the host 700 so that the driving controller 200 perceives the touch event after the first delay DY1, the second delay DY2 and the third delay DY3.

In FIG. 4, the touch event may be occurred in an early time point of the seven frame F7 and the host 700 may perceive the touch event in a late time point of the seven frame F7 due to the delay.

When the host 700 perceives the touch event in the late time point of the seven frame F7, the host 700 may change the input image data of an eighth frame F8 to "D." Because the input image data (D) of the eighth frame F8 is different from the input image data (C) of the seventh frame F7, the driving controller 200 determines the input image data as the movie image in the eighth frame F8 and the driving controller 200 drives the display apparatus in the normal driving mode (a high frequency driving mode) from a ninth frame F9. As a result, although the touch event occurs in the seventh frame F7, the display panel 100 is driven in the low frequency driving mode until the eighth frame F8. In the eighth frame F8, the output image is output in the driving frequency of the low frequency driving mode so that the output image of the eight frame F8 is not D but C due to the data delay.

In the low frequency driving mode, a cycle of refreshing the image may be long. Accordingly, when the touch event occurs in the seventh frame F7 and a changed image E is displayed in the ninth frame F9, a user may perceive the delay of the image transition.

Figure 5:
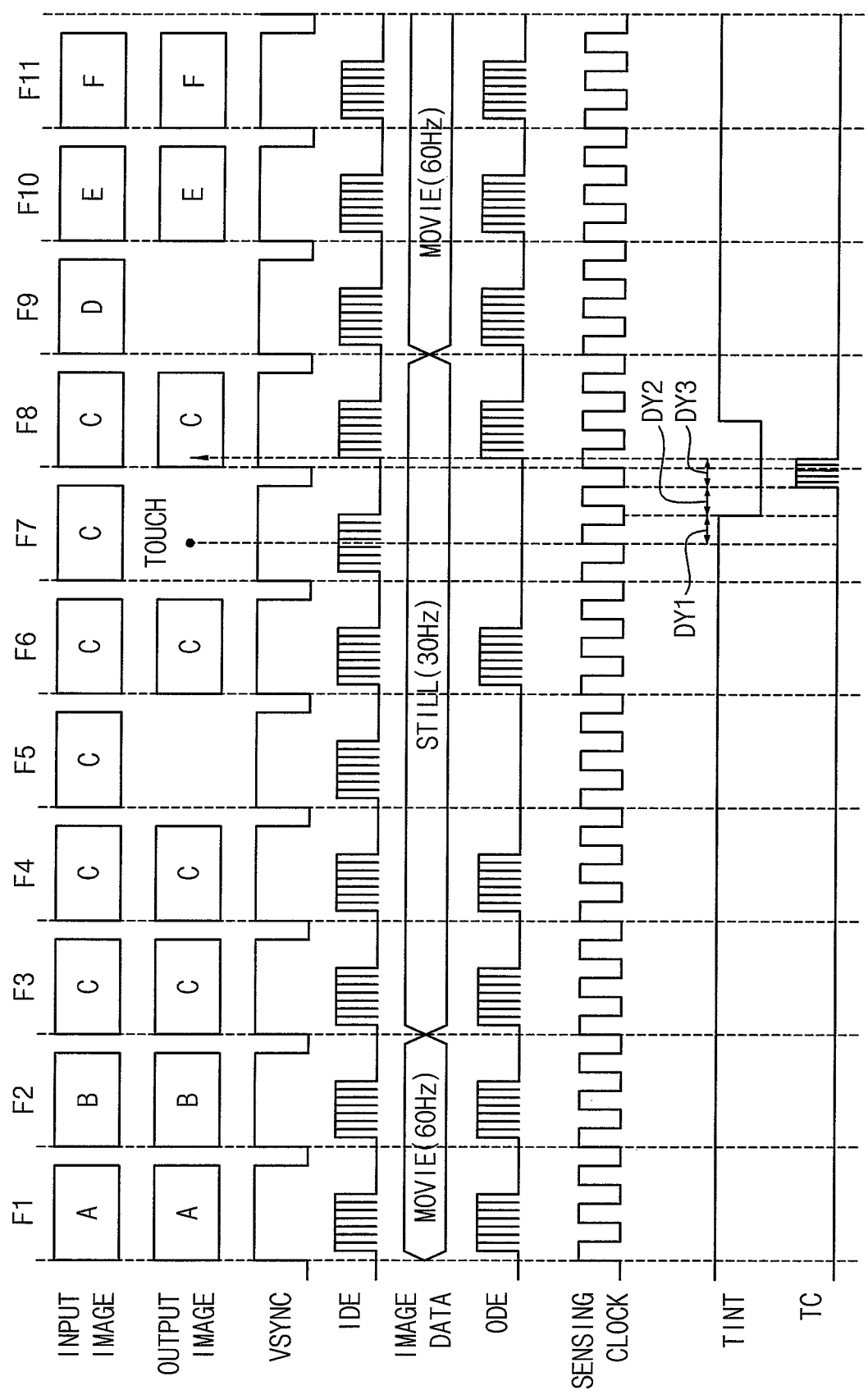
FIG. 5 is a timing diagram illustrating input and output signals of a display apparatus according to a comparative embodiment.

FIG. 5 is a timing diagram illustrating input and output signals of a display apparatus according to a comparative embodiment. FIG. 5 represents a case worse than a case of FIG. 4.

Referring to FIGS. 1 to 5, the input image data INPUT IMAGE during first to third frames F1 to F3 may be respectively A, B and C. The input image data INPUT IMAGE during the first to third frames F1 to F3 are different from one another so that the driving controller 200 may determine the input image data INPUT IMAGE during the first to third frames F1 to F3 as the movie image. Thus, during the first to third frames F1 to F3, the data signal OUTPUT IMAGE is driven in a relatively high frequency (e.g. 60 Hz).

The input image data INPUT IMAGE of a fourth frame F4 is same as the input image data INPUT IMAGE of the third frame F3 so that the driving controller 200 may determine the input image data INPUT IMAGE of the fourth frame F4 as the still image.

The input image data INPUT IMAGE during fifth to seventh frames F5 to F7 are same as the input image data INPUT IMAGE of the fourth frame F4 so that the driving controller 200 may determine the input image data INPUT IMAGE during the fifth to seventh frames F5 to F7 as the still image.

When the input image data (INPUT IMAGE) represent the movie image, the display panel 100 is driven in the normal driving mode. When the input image data INPUT IMAGE represent the still image, the display panel 100 is driven in the low frequency driving mode.

In FIG. 5, a touch event occurs on the display panel 100 in the seventh frame F7.

When the touch event occurs on the display panel 100, the touch driver 600 detects the touch event. When the touch event occurs, a related-art touch driver may output the touch interrupt signal TINT and the touch coordinate signal TC to the host 700.

The host 700 may change the input image data INPUT IMAGE to respond the touch event. The host 700 may change the input image data INPUT IMAGE based on the touch interrupt signal TINT and the touch coordinate signal TC and output the input image data INPUT IMAGE to the driving controller 200.

In a related-art display apparatus, the driving controller 200 may receive the touch event from the host 700 so that the driving controller 200 perceives the touch event after the first delay DY1, the second delay DY2 and the third delay DY3.

In FIG. 5, the touch event may be occurred in a medium time point of the seven frame F7 and the host 700 may perceive the touch event in an early time point of the eighth frame F8 due to the delay.

When the host 700 perceives the touch event in the early time point of the eighth frame F8, the host 700 may change the input image data of a ninth frame F9 to "D." Because the input image data (C) of the eighth frame F8 is same as the input image data (C) of the seventh frame F7, the driving controller 200 determines the input image data as the still image in the eighth frame F8 and the driving controller 200 drives the display apparatus in the low frequency driving mode in the eighth frame F8. Because the input image data (D) of the ninth frame F9 is different from the input image data (C) of the eighth frame F8, the driving controller 200 determines the input image data as the movie image in the ninth frame F9 and the driving controller 200 drives the display apparatus in the normal driving mode (a high frequency driving mode) from a tenth frame F10. As a result, although the touch event occurs in the seventh frame F7, the display panel 100 is driven in the low frequency driving mode until the ninth frame F9.

In the low frequency driving mode, a cycle of refreshing the image may be long. Accordingly, when the touch event occurs in the seventh frame F7 and a changed image E is displayed in the tenth frame F10, a user may perceive the delay of the image transition and the delay of the image transition in FIG. 5 may be longer than the delay of the image transition in FIG. 4.

Figure 6:
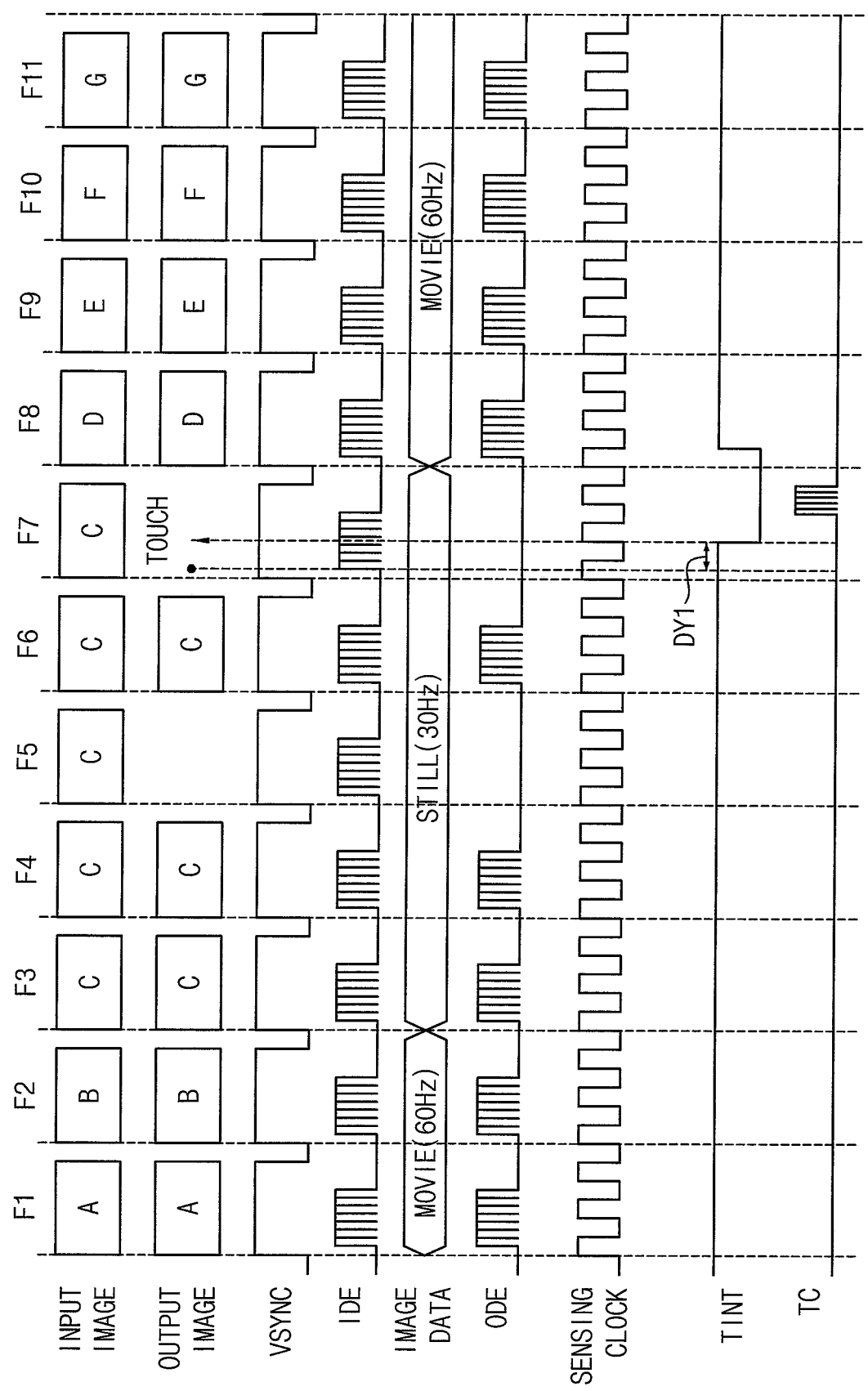
FIG. 6 is a timing diagram illustrating input and output signals of the display apparatus of FIG. 1.

FIG. 6 is a timing diagram illustrating input and output signals of the display apparatus of FIG. 1. In FIG. 6, the touch driver 600 directly outputs the touch interrupt signal TINT to the driving controller 200 unlike the comparative embodiments in FIGS. 4 and 5.

Referring to FIGS. 1 to 6, the input image data INPUT IMAGE during first to third frames F1 to F3 may be respectively A, B and C. The input image data INPUT IMAGE during the first to third frames F1 to F3 are different from one another so that the driving controller 200 may determine the input image data INPUT IMAGE during the first to third frames F1 to F3 as the movie image. Thus, during the first to third frames F1 to F3, the data signal OUTPUT IMAGE is driven in a relatively high frequency (e.g. 60 Hz).

The input image data INPUT IMAGE of a fourth frame F4 is same as the input image data INPUT IMAGE of the third frame F3 so that the driving controller 200 may determine the input image data INPUT IMAGE of the fourth frame F4 as the still image.

The input image data INPUT IMAGE during fifth to seventh frames F5 to F7 are same as the input image data INPUT IMAGE of the fourth frame F4 so that the driving controller 200 may determine the input image data INPUT IMAGE during the fifth to seventh frames F5 to F7 as the still image.

When the input image data (INPUT IMAGE) represent the movie image, the display panel 100 is driven in the normal driving mode. When the input image data INPUT IMAGE represent the still image, the display panel 100 is driven in the low frequency driving mode.

In FIG. 6, a touch event occurs on the display panel 100 in the seventh frame F7.

When the touch event occurs on the display panel 100, the touch driver 600 detects the touch event. When the touch event occurs, a related-art touch driver may output the touch interrupt signal TINT and the touch coordinate signal TC only to the host 700. In contrast, when the touch event occurs, the touch driver 600 according to some example embodiments outputs the touch interrupt signal TINT to the host 700 and the driving controller 200.

The host 700 may change the input image data INPUT IMAGE to respond the touch event. The host 700 may change the input image data INPUT IMAGE based on the touch interrupt signal TINT and the touch coordinate signal TC and output the input image data INPUT IMAGE to the driving controller 200.

According to some example embodiments, the driving controller receives the touch event from the touch driver 600 before receiving the touch event from the host 700 so that the driving controller 200 perceives the touch event only after the first delay DY1.

In FIG. 6, the touch event may be occurred in an early time point of the seven frame F7 and the host 700 may perceive the touch event in a late time point of the seventh frame F7 and the driving controller 200 may perceive the touch event in a medium time point of the seventh frame F7 due to the delay.

When the host 700 perceives the touch event in the late time point of the seventh frame F7, the host 700 may change the input image data of a eighth frame F8 to "D" same as in the comparative embodiment of FIG. 4. Because the related-art driving controller 200 may not receive the touch event in advance, the related-art driving controller 200 may compare the input image data of the eighth frame F8 and the input image data of the seventh frame F7 and determine the input image data as the movie image in the eighth frame F8. The related-art driving controller 200 may drive the display panel 100 in the normal driving mode from the ninth frame F9.

However, according to some example embodiments, because the driving controller 200 receives the touch event from the touch driver 600 in advance, the driving controller 200 may drive the display panel 100 in the normal driving mode from the eighth frame F8. In the comparative embodiment of FIG. 4, the output image C of the eighth frame F8 which is different from the input image data D of the eighth frame F8 is outputted. However, in the present example embodiment of FIG. 6, the output image D of the eighth frame F8 which is same as the input image data D of the eighth frame F8 is outputted so that the delay of the image transition may be prevented or reduced.

When the display panel 100 is driven in the low frequency driving mode and the touch event is perceived by the driving controller 200, the driving controller 200 drives the display panel 100 in the normal driving mode in a right next frame of a frame when the touch event is perceived.

According to some example embodiments, the touch driver 600 directly outputs the touch interrupt signal TINT representing the occurrence of the touch event to the driving controller 200 so that the driving controller 200 may perceive the touch event immediately.

The driving controller 200 may determine the touch event immediately so that the display defect due to the delay of the image transition in the low frequency driving mode may be prevented or reduced. Therefore, the display quality of the display panel 100 may be enhanced.

Figure 7:
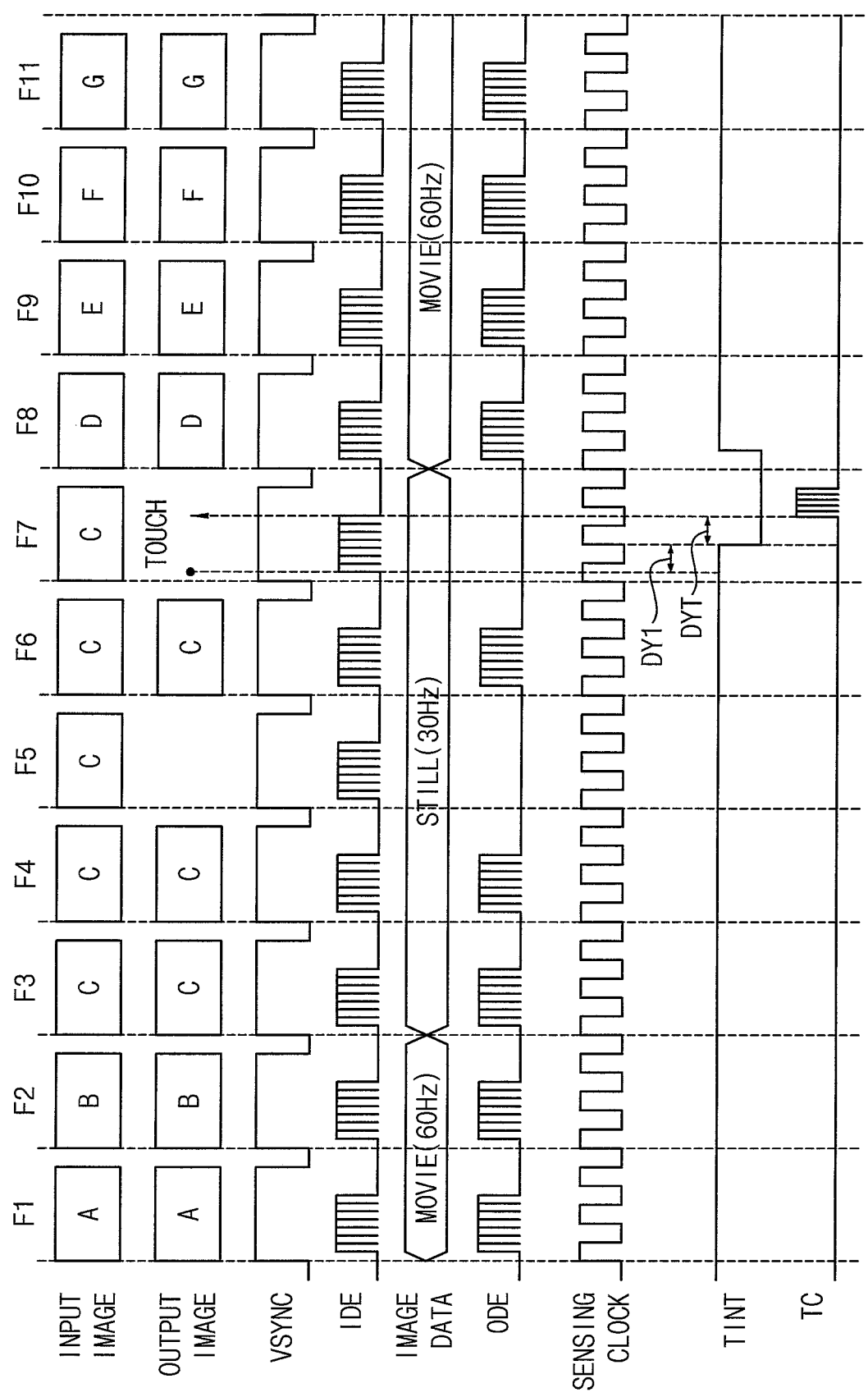
FIG. 7 is a timing diagram illustrating input and output signals of a display apparatus according to some example embodiments of the present inventive concept.

FIG. 7 is a timing diagram illustrating input and output signals of a display apparatus according to some example embodiments of the present inventive concept.

The display apparatus and the method of driving the display apparatus according to the present example embodiment is substantially the same as the display apparatus and the method of driving the display apparatus of the previous example embodiment explained referring to FIGS. 1 to 3 and 6 except for an output timing of the touch interrupt signal. Thus, the same reference numerals will be used to refer to the same or like parts as those described in the previous example embodiment of FIGS. 1 to 3 and 6 and any repetitive explanation concerning the above elements will be omitted.

Referring to FIGS. 1 to 3 and 7, the display apparatus includes a display panel 100 and a display panel driver. The display panel driver includes a driving controller 200, a gate driver 300, a gamma reference voltage generator 400 and a data driver 500. The display apparatus may further include a touch driver 600. The display apparatus may further include a host 700.

The touch driver 600 may determine a touch event of the display panel 100. The touch driver 600 may generate a touch interrupt signal TINT representing an occurrence of the touch event and a touch coordinate signal TC representing coordinates of a touch position. The touch driver 600 may output the touch interrupt signal TINT and the touch coordinate signal TC to the host 700. In addition, the touch driver 600 may output the touch interrupt signal TINT to the driving controller 200. Thus, according to some example embodiments, the driving controller 200 may include an input port receiving the touch interrupt signal TINT from the touch driver 600.

The input image data INPUT IMAGE during first to third frames F1 to F3 may be respectively A, B and C. The input image data INPUT IMAGE during the first to third frames F1 to F3 are different from one another so that the driving controller 200 may determine the input image data INPUT IMAGE during the first to third frames F1 to F3 as the movie image. Thus, during the first to third frames F1 to F3, the data signal OUTPUT IMAGE is driven in a relatively high frequency (e.g. 60 Hz).

The input image data INPUT IMAGE of a fourth frame F4 is same as the input image data INPUT IMAGE of the third frame F3 so that the driving controller 200 may determine the input image data INPUT IMAGE of the fourth frame F4 as the still image.

The input image data INPUT IMAGE during fifth to seventh frames F5 to F7 are same as the input image data INPUT IMAGE of the fourth frame F4 so that the driving controller 200 may determine the input image data INPUT IMAGE during the fifth to seventh frames F5 to F7 as the still image.

When the input image data (INPUT IMAGE) represent the movie image, the display panel 100 is driven in the normal driving mode. When the input image data INPUT IMAGE represent the still image, the display panel 100 is driven in the low frequency driving mode.

In FIG. 7, a touch event occurs on the display panel 100 in the seventh frame F7.

When the touch event occurs on the display panel 100, the touch driver 600 detects the touch event. When the touch event occurs, a related-art touch driver may output the touch interrupt signal TINT and the touch coordinate signal TC only to the host 700. In contrast, when the touch event occurs, the touch driver 600 according to some example embodiments outputs the touch interrupt signal TINT to the host 700 and the driving controller 200.

According to some example embodiments, the touch driver 600 may output the touch interrupt signal TINT to the driving controller 200 after a predetermined time delay DYT. When the touch driver 600 immediately outputs the touch interrupt signal TINT to the driving controller 200, the driving controller 200 may perceive the occurrence of the touch event prior to the host 700. Accordingly, when the driving controller 200 perceives the occurrence of the touch event prior to the host 700, an unexpected display defect of the display image of the display panel 100 may be generated or the driving mode of the display panel 100 is converted to the normal driving mode earlier than a desired frame so that the power consumption of the display apparatus may be increased. Thus, the touch driver 600 may output the touch interrupt signal TINT to the driving controller 200 after the predetermined time delay DYT and the predetermined time delay DYT may be properly adjusted considering the display defect and the power consumption of the display apparatus.

For example, the predetermined time delay DYT may adjust the timing of the touch interrupt signal TINT such that the touch interrupt signal TINT is simultaneously transmitted to the driving controller 200 and the host 700.

For example, the predetermined time delay DYT may adjust the timing of the touch interrupt signal TINT such that the touch interrupt signal TINT is outputted to the driving controller 200 at a falling edge of the touch coordinate signal TC.

The host 700 may change the input image data INPUT IMAGE in response to the touch event. The host 700 may change the input image data INPUT IMAGE based on the touch interrupt signal TINT and the touch coordinate signal TC and output the changed input image data INPUT IMAGE to the driving controller 200.

In FIG. 7, the touch event may be occurred in an early time point of the seven frame F7 and the host 700 may perceive the touch event in a late time point of the seventh frame F7 and the driving controller 200 may perceive the touch event in a late time point of the seventh frame F7 due to the delay.

When the host 700 perceives the touch event in the late time point of the seventh frame F7, the host 700 may change the input image data of a eighth frame F8 to "D" same as in the comparative embodiment of FIG. 4. Because a related-art driving controller 200 may not receive the touch event in advance, the related-art driving controller 200 may compare the input image data of the eighth frame F8 and the input image data of the seventh frame F7 and determine the input image data same as the movie image in the eighth frame F8. The related-art driving controller 200 may drive the display panel 100 in the normal driving mode from the ninth frame F9.

However, according to some example embodiments, because the driving controller 200 receives the touch event from the touch driver 600 in advance, the driving controller 200 may drive the display panel 100 in the normal driving mode from the eighth frame F8. In the comparative embodiment of FIG. 4, the output image C of the eighth frame F8 which is different from the input image data D of the eighth frame F8 is outputted. However, in the present example embodiment of FIG. 7, the output image D of the eighth frame F8 which is same as the input image data D of the eighth frame F8 is outputted so that the delay of the image transition may be prevented or reduced.

According to some example embodiments, the touch driver 600 directly outputs the touch interrupt signal TINT representing the occurrence of the touch event to the driving controller 200 so that the driving controller 200 may perceive the touch event immediately.

The driving controller 200 may determine the touch event immediately so that the display defect due to the delay of the image transition in the low frequency driving mode may be prevented or reduced. Therefore, the display quality of the display panel 100 may be enhanced.

Figure 8:
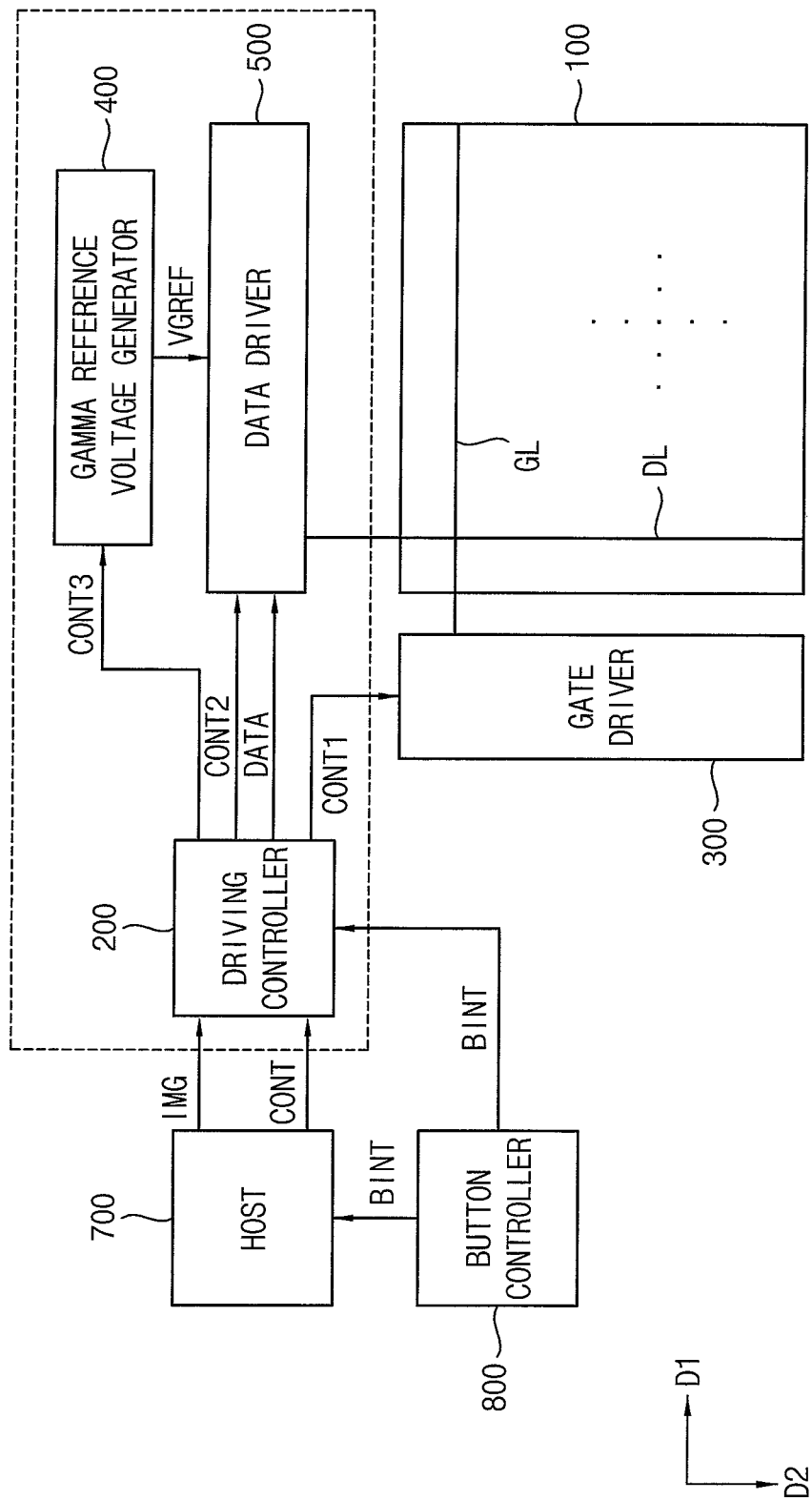
FIG. 8 is a block diagram illustrating a display apparatus according to some example embodiments of the present inventive concept.

FIG. 8 is a block diagram illustrating a display apparatus according to some example embodiments of the present inventive concept.

The display apparatus and the method of driving the display apparatus according to the present example embodiment is substantially the same as the display apparatus and the method of driving the display apparatus of the previous example embodiment explained referring to FIGS. 1 to 3 and 6 except that the display apparatus includes a button controller. Thus, the same reference numerals will be used to refer to the same or like parts as those described in the previous example embodiment of FIGS. 1 to 3 and 6 and any repetitive explanation concerning the above elements will be omitted.

Referring to FIGS. 2, 3, 6 and 8, the display apparatus includes a display panel 100 and a display panel driver. The display panel driver includes a driving controller 200, a gate driver 300, a gamma reference voltage generator 400 and a data driver 500. The display apparatus may further include a host 700. The display apparatus may further include a button controller 800. Although not shown in figures, the display apparatus may further include the touch driver 600 of FIG. 1. Alternatively, the display apparatus may not include the touch driver 600 of FIG. 1.

The button controller 800 may determine a button input event of the display apparatus. The button controller 800 may generate a button interrupt signal BINT representing an occurrence of the button input event at an input button of the display apparatus. The button controller 800 may output the button interrupt signal BINT to the host 700. In addition, the button controller 800 may output the button interrupt signal BINT to the driving controller 200. Thus, according to some example embodiments, the driving controller 200 may include an input port receiving the button interrupt signal BINT from the button controller 800.

The host 700 outputs the input image data IMG and the input control signal CONT to the driving controller 200.

The host 700 may receive the button interrupt signal BINT from the button controller 800. The host 700 may change the input image data IMG to change a display image of the display panel 100 in response to the button interrupt signal BINT.

The display panel 100 may be driven in a normal driving mode and a low frequency driving mode. In the normal driving mode, the display panel 100 may be driven in a normal driving frequency. In the low frequency driving mode, the display panel 100 may be driven in a driving frequency less than the normal driving frequency.

For example, when the input image data represent a video image, the display panel 100 may be driven in the normal driving mode. For example, when the input image data represent a still image, the display panel may be driven in the low frequency driving mode. For example, when the display apparatus is operated in the always on mode, the display panel may be driven in the low frequency driving mode.

When the button input event occurs, the button controller 800 detects the button input event. When the button input event occurs, a related-art button controller may output the button interrupt signal BINT only to the host 700. In contrast, when the button input event occurs, the button controller 800 according to some example embodiments outputs the button interrupt signal BINT to the host 700 and the driving controller 200.

According to some example embodiments, the driving controller receives the button input event from the button controller 800 before receiving the button input event from the host 700 so that the driving controller 200 perceives the button input event only after the first delay DY1 of FIG. 6.

When the display panel 100 is driven in the low frequency driving mode and the button input event is perceived by the driving controller 200, the driving controller 200 drives the display panel 100 in the normal driving mode in a right next frame of a frame when the button input event is perceived.

According to some example embodiments, the button controller 800 directly outputs the button interrupt signal BINT representing the occurrence of the button input event to the driving controller 200 so that the driving controller 200 may perceive the button input event immediately.

The driving controller 200 may determine the button input event immediately so that the display defect due to the delay of the image transition in the low frequency driving mode may be prevented or reduced. Therefore, the display quality of the display panel 100 may be enhanced.

Figure 9:
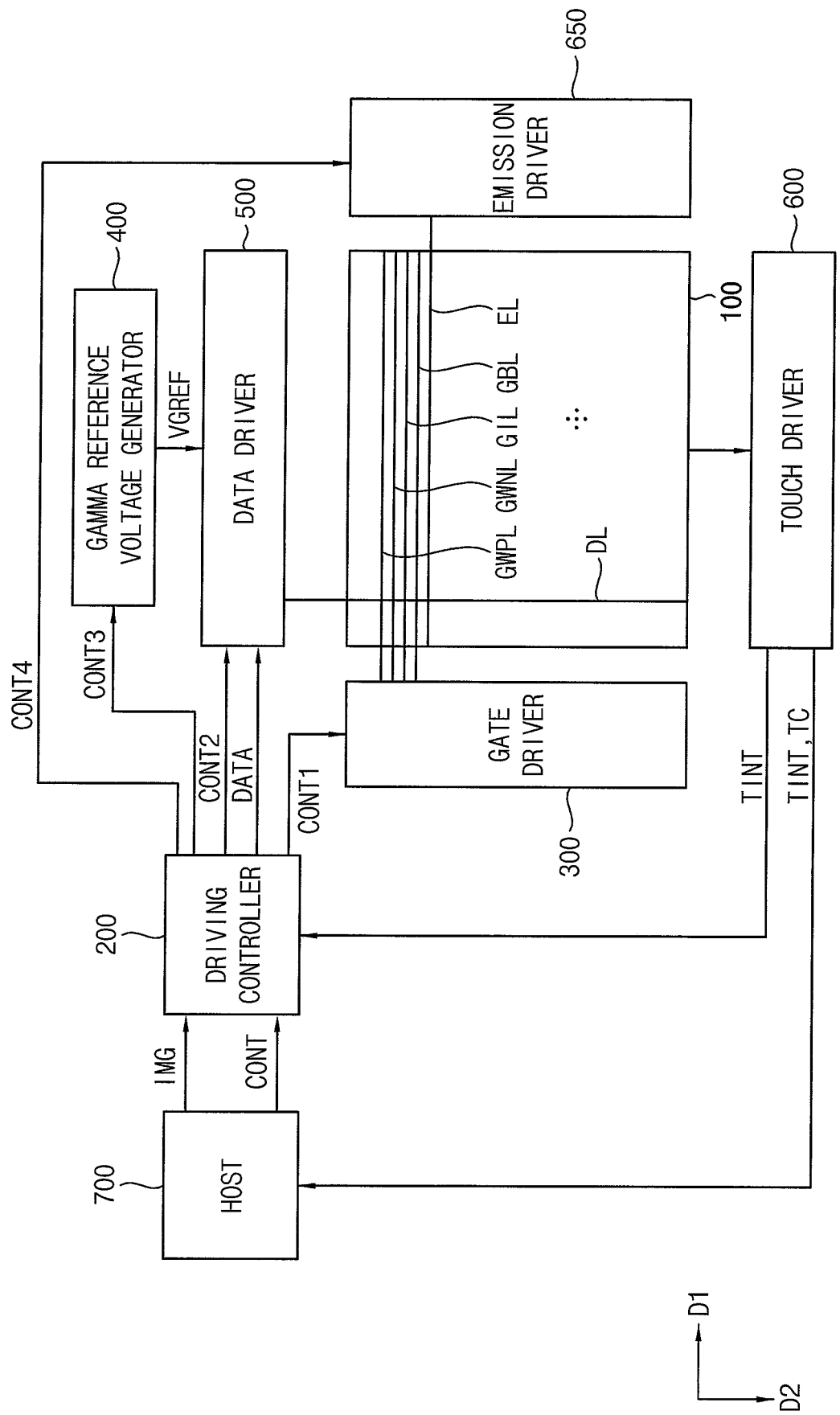
FIG. 9 is a block diagram illustrating a display apparatus according to some example embodiments of the present inventive concept.
Figure 10:
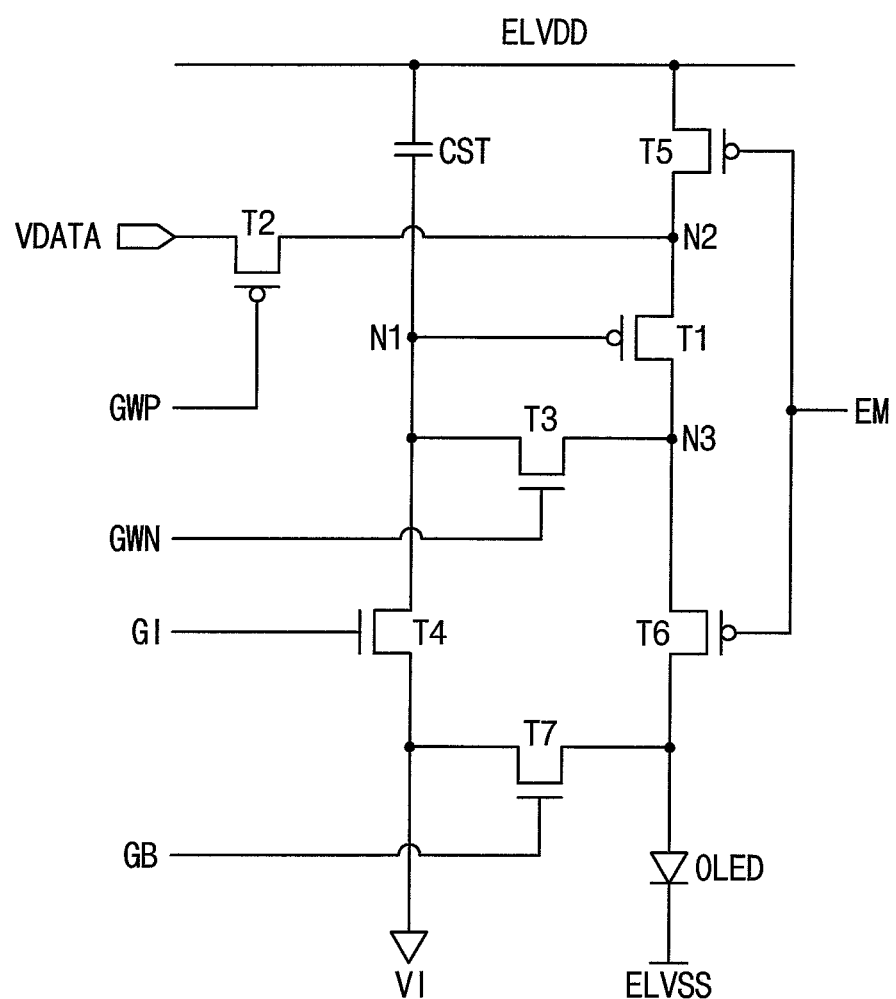
FIG. 10 is a circuit diagram illustrating a pixel of a display panel of FIG. 9.
Figure 11:
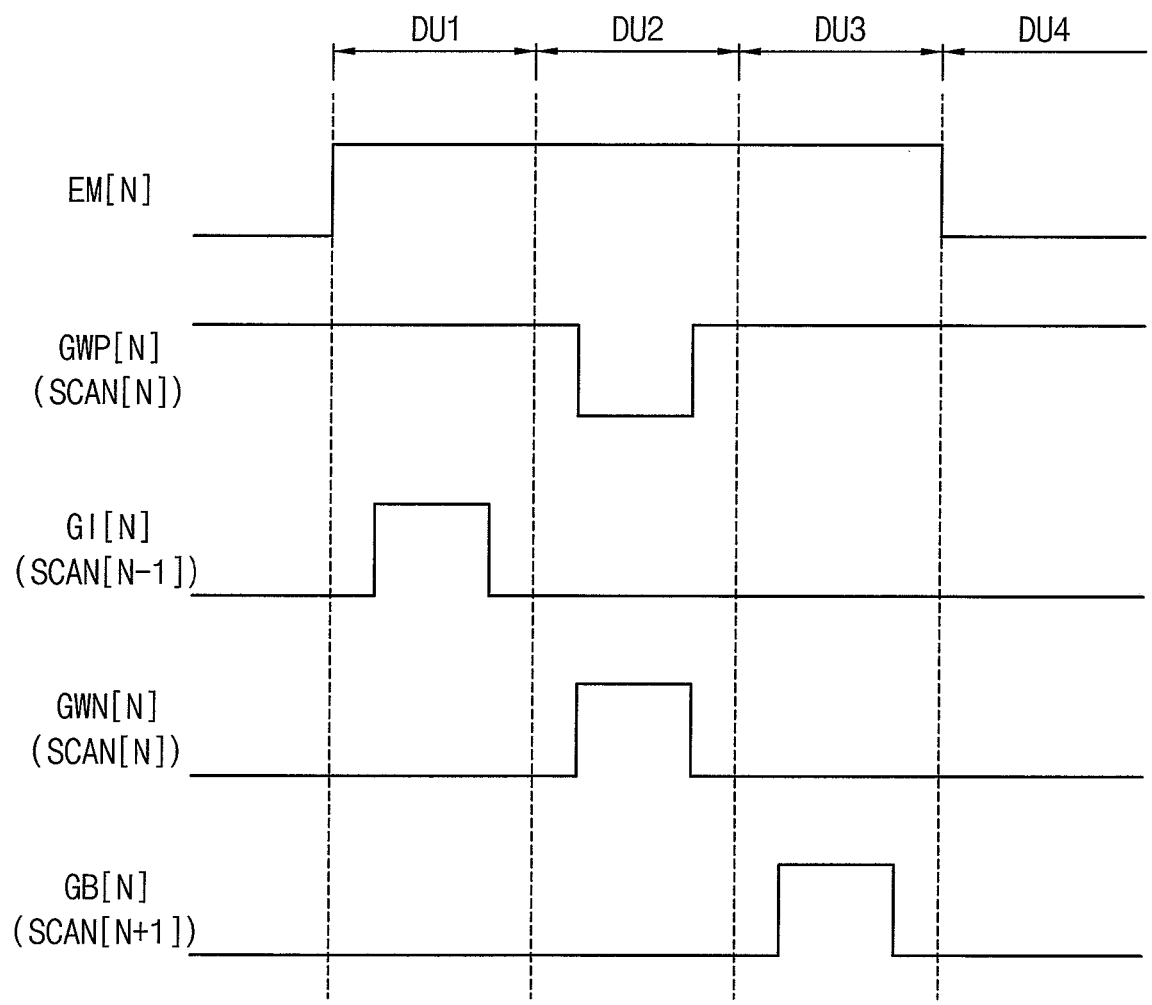
FIG. 11 is a timing diagram illustrating signals applied to the pixel of the display panel of FIG. 10.
Figure 12:
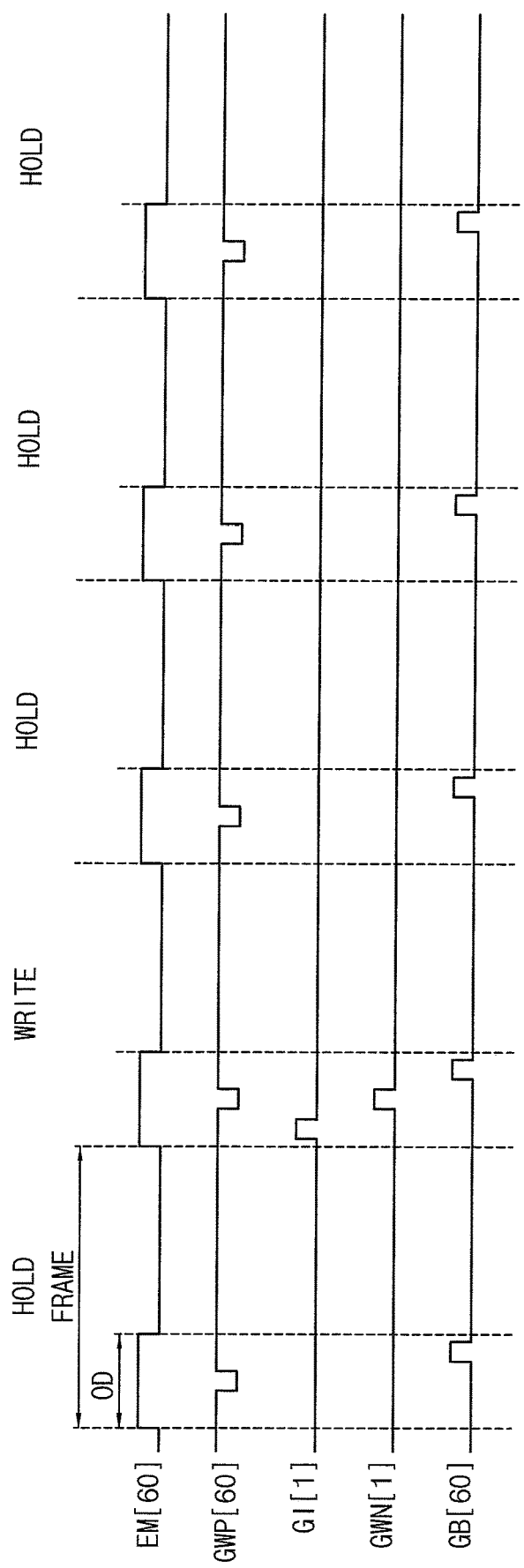
FIG. 12 is a timing diagram illustrating signals applied to the pixel of the display panel of FIG. 10 in a low frequency driving mode.

FIG. 9 is a block diagram illustrating a display apparatus according to some example embodiments of the present inventive concept. FIG. 10 is a circuit diagram illustrating a pixel of a display panel of FIG. 9. FIG. 11 is a timing diagram illustrating signals applied to the pixel of the display panel of FIG. 10. FIG. 12 is a timing diagram illustrating signals applied to the pixel of the display panel of FIG. 10 in a low frequency driving mode.

The display apparatus and the method of driving the display apparatus according to the present example embodiment is substantially the same as the display apparatus and the method of driving the display apparatus of the previous example embodiment explained referring to FIGS. 1 to 3 and 6 except for the structures of the display panel and the emission driver. Thus, the same reference numerals will be used to refer to the same or like parts as those described in the previous example embodiment of FIGS. 1 to 3 and 6 and any repetitive explanation concerning the above elements will be omitted.

Referring to FIGS. 2, 3, 6 and 9 to 12, the display apparatus includes a display panel 100 and a display panel driver. The display panel driver includes a driving controller 200, a gate driver 300, a gamma reference voltage generator 400 and a data driver 500. The display apparatus may further include an emission driver 650. The display apparatus may further include a touch driver 600. The display apparatus may further include a host 700.

The display panel 100 includes a plurality of gate lines GWPL, GWNL, GIL and GBL, a plurality of data lines DL, a plurality of emission lines EL and a plurality of pixels electrically connected to the gate lines GWPL, GWNL, GIL and GBL, the data lines DL and the emission lines EL. The gate lines GWPL, GWNL, GIL and GBL may extend in a first direction D1, the data lines DL may extend in a second direction D2 crossing the first direction D1 and the emission lines EL may extend in the first direction D1.

The driving controller 200 generates a first control signal CONT1, a second control signal CONT2, a third control signal CONT3, a fourth control signal CONT4 and a data signal DATA based on the input image data IMG and the input control signal CONT.

The emission driver 650 generates emission signals to drive the emission lines EL in response to the fourth control signal CONT4 received from the driving controller 200. The emission driver 650 may output the emission signals to the emission lines EL.

The touch driver 600 may determine a touch event of the display panel 100. The touch driver 600 may generate a touch interrupt signal TINT representing an occurrence of the touch event and a touch coordinate signal TC representing coordinates of a touch position. The touch driver 600 may output the touch interrupt signal TINT and the touch coordinate signal TC to the host 700. In addition, the touch driver 600 may output the touch interrupt signal TINT to the driving controller 200. Thus, according to some example embodiments, the driving controller 200 may include an input port receiving the touch interrupt signal TINT from the touch driver 600.

The host 700 outputs the input image data IMG and the input control signal CONT to the driving controller 200.

The host 700 may receive the touch interrupt signal TINT and the touch coordinate signal TC from the touch driver 600. The host 700 may change the input image data IMG to change a display image of the display panel 100 in response to the touch interrupt signal TINT and the touch coordinate signal TC.

The display panel 100 includes the plurality of the pixels. Each pixel includes an organic light emitting element OLED.

The pixel receives a data write gate signal GWP and GWN, a data initialization gate signal GI, an organic light emitting element initialization signal GB, the data voltage VDATA and the emission signal EM and the organic light emitting element OLED of the pixel emits light corresponding to the level of the data voltage VDATA to display the image.

According to some example embodiments, the pixel may include a switching element of a first type and a switching element of a second type different from the first type. For example, the switching element of the first type may be a polysilicon thin film transistor. For example, the switching element of the first type may be a low temperature polysilicon (LTPS) thin film transistor. For example, the switching element of the second type may be an oxide thin film transistor. For example, the switching element of the first type may be a P-type transistor and the switching element of the second type may be an N-type transistor.

For example, the data write gate signal may include a first data write gate signal GWP and a second data write gate signal GWN. The first data write gate signal GWP may be applied to the P-type transistor so that the first data write gate signal GWP has an activation signal of a low level corresponding to a data writing timing. The second data write gate signal GWN may be applied to the N-type transistor so that the second data write gate signal GWN has an activation signal of a high level corresponding to the data writing timing.

At least one of the pixels may include first to seventh pixel switching elements T1 to T7, a storage capacitor CST and the organic light emitting element OLED.

The first pixel switching element T1 includes a control electrode connected to a first node N1, an input electrode connected to a second node N2 and an output electrode connected to a third node N3. For example, the first pixel switching element T1 may be the polysilicon thin film transistor. For example, the first pixel switching element T1 may be the P-type thin film transistor.

The second pixel switching element T2 includes a control electrode to which the first data write gate signal GWP is applied, an input electrode to which the data voltage VDATA is applied and an output electrode connected to the second node N2. For example, the second pixel switching element T2 may be the polysilicon thin film transistor. For example, the second pixel switching element T2 may be the P-type thin film transistor.

The third pixel switching element T3 includes a control electrode to which the second data write gate signal GWN is applied, an input electrode connected to the first node N1 and an output electrode connected to the third node N3. For example, the third pixel switching element T3 may be the oxide thin film transistor. For example, the third pixel switching element T3 may be the N-type thin film transistor.

The fourth pixel switching element T4 includes a control electrode to which the data initialization gate signal GI is applied, an input electrode to which an initialization voltage VI is applied and an output electrode connected to the first node N1. For example, the fourth pixel switching element T4 may be the oxide thin film transistor. For example, the fourth pixel switching element T4 may be the N-type thin film transistor.

The fifth pixel switching element T5 includes a control electrode to which the emission signal EM is applied, an input electrode to which a high power voltage ELVDD is applied and an output electrode connected to the second node N2. For example, the fifth pixel switching element T5 may be the polysilicon thin film transistor. For example, the fifth pixel switching element T5 may be the P-type thin film transistor.

The sixth pixel switching element T6 includes a control electrode to which the emission signal EM is applied, an input electrode connected to the third node N3 and an output electrode connected to an anode electrode of the organic light emitting element OLED. For example, the sixth pixel switching element T6 may be the polysilicon thin film transistor. For example, the sixth pixel switching element T6 may be a P-type thin film transistor. The control electrode of the sixth pixel switching element T6 may be a gate electrode, the input electrode of the sixth pixel switching element T6 may be a source electrode and the output electrode of the sixth pixel switching element T6 may be a drain electrode.

The seventh pixel switching element T7 includes a control electrode to which the organic light emitting element initialization gate signal GB is applied, an input electrode to which the initialization voltage VI is applied and an output electrode connected to the anode electrode of the organic light emitting element OLED. For example, the seventh pixel switching element T7 may be the oxide thin film transistor. For example, the seventh pixel switching element T7 may be the N-type thin film transistor. Alternatively, the seventh pixel switching element T7 may be the polysilicon thin film transistor. For example, the seventh pixel switching element T7 may be a P-type thin film transistor. When the seventh pixel switching element T7 is the P-type thin film transistor, the organic light emitting element initialization gate signal GB may have an activation signal of a low level unlike FIGS. 11 and 12.

The storage capacitor CST includes a first electrode to which the high power voltage ELVDD is applied and a second electrode connected to the first node N1.

The organic light emitting element OLED includes the anode electrode and a cathode electrode to which a low power voltage ELVSS is applied.

In FIG. 11, during a first duration DU1, the first node N1 and the storage capacitor CST are initialized in response to the data initialization gate signal GI. During a second duration DU2, a threshold voltage |VTH| of the first pixel switching element T1 is compensated and the data voltage VDATA of which the threshold voltage |VTH| is compensated is written to the first node N1 in response to the first and second data write gate signals GWP and GWN. During a third duration DU3, the anode electrode of the organic light emitting element OLED is initialized in response to the organic light emitting element initialization gate signal GB. During a fourth duration DU4, the organic light emitting element OLED emit the light in response to the emission signal EM so that the display panel 100 displays the image.

During the first duration DU1, the data initialization gate signal GI may have an active level. For example, the active level of the data initialization gate signal GI may be a high level. When the data initialization gate signal GI has the active level, the fourth pixel switching element T4 is turned on so that the initialization voltage VI may be applied to the first node N1. The data initialization gate signal GI[N] of a present stage may be generated based on a scan signal SCAN[N−1] of a previous stage.

During the second duration DU2, the first data write gate signal GWP and the second data write gate signal GWN may have an active level. For example, the active level of the first data write gate signal GWP may be a low level and the active level of the second data write gate signal GWN may be a high level. When the first data write gate signal GWP and the second data writhe gate signal GWN have the active level, the second pixel switching element T2 and the third pixel switching element T3 are turned on. In addition, the first pixel switching element T1 is turned on in response to the initialization voltage VI. The first data write gate signal GWP[N] of the present stage may be generated based on a scan signal SCAN[N] of the present stage. The second data write gate signal GWN[N] of the present stage may be generated based on the scan signal SCAN[N] of the present stage.

A voltage which is subtraction an absolute value |VTH| of the threshold voltage of the first pixel switching element T1 from the data voltage VDATA may be charged at the first node N1 along a path generated by the first to third pixel switching elements T1, T2 and T3.

During the third duration DU3, the organic light emitting element initialization signal GB may have an active level. For example, the active level of the organic light emitting element initialization signal GB may be a high level. When the organic light emitting element initialization signal GB has the active level, the seventh pixel switching element T7 is turned on so that the initialization voltage VI may be applied to the anode electrode of the organic light emitting element OLED. The organic light emitting element initialization signal GB[N] of the present stage may be generated based on a scan signal SCAN[N+1] of a next stage.

During the fourth duration DU4, the emission signal EM may have an active level. The active level of the emission signal EM may be a low level. When the emission signal EM has the active level, the fifth pixel switching element T5 and the sixth pixel switching element T6 are turned on. In addition, the first pixel switching element T1 is turned on by the data voltage VDATA.

A driving current flows through the fifth pixel switching element T5, the first pixel switching element T1 and the sixth pixel switching element T6 to drive the organic light emitting element OLED. An intensity of the driving current may be determined by the level of the data voltage VDATA. A luminance of the organic light emitting element OLED is determined by the intensity of the driving current. The driving current ISD flowing through a path from the input electrode to the output electrode of the first pixel switching element T1 is determined as following Equation 1.

$$ISD = \frac{1}{2}\mu Cox \frac{W}{L}(VSG - |VTH|)^2 \quad \text{[Equation 1]}$$

In Equation 1, µ is a mobility of the first pixel switching element T1. Cox is a capacitance per unit area of the first pixel switching element T1. W/L is a width to length ratio of the first pixel switching element T1. VSG is a voltage between the input electrode N2 of the first pixel switching element T1 and the control node N1 of the first pixel switching element T1. |VTH| is the threshold voltage of the first pixel switching element T1.

The voltage VG of the first node N1 after the compensation of the threshold voltage |VTH| during the second duration DU2 may be represented as following Equation 2.

$$VG = VDATA - |VTH| \quad \text{[Equation 2]}$$

When the organic light emitting element OLED emits the light during the fourth duration DU4, the driving voltage VOV and the driving current ISD may be represented as following Equations 3 and 4. In Equation 3, VS is a voltage of the second node N2.

$$VOV = VS - VG - |VTH| = \quad \text{[Equation 3]}$$
$$ELVDD - (VDATA - |VTH|) - |VTH| = ELVDD - VDATA$$

$$ISD = \frac{1}{2}\mu Cox \frac{W}{L}(ELVDD - VDATA)^2 \quad \text{[Equation 4]}$$

The threshold voltage |VTH| is compensated during the second duration DU2, so that the driving current ISD may be determined regardless of the threshold voltage |VTH| of the first pixel switching element T1 when the organic light emitting element OLED emits the light during the fourth duration DU4.

According to some example embodiments, when the image displayed on the display panel 100 is a still image or the display panel is operated in Always On Mode, a driving frequency of the display panel 100 may be decreased to reduce a power consumption. When all of the switching elements of the pixel of the display panel 100 are polysilicon thin film transistor, a flicker may be generated due to a leakage current of the pixel switching element in the low frequency driving mode. Thus, some of the pixel switching elements may be designed using the oxide thin film transistors. According to some example embodiments, the third pixel switching element T3, the fourth pixel switching element T4 and the seventh pixel switching element T7 may be the oxide thin film transistors. The first pixel switching element T1, the second pixel switching element T2, the fifth pixel switching element T5 and the sixth pixel switching element T6 may be the polysilicon thin film transistors.

The display panel 100 may be driven in a normal driving mode in which the display panel 100 is driven in a normal driving frequency and in a low frequency driving mode in which the display panel 100 is driven in a frequency less than the normal driving frequency.

For example, when the input image data represent a video image, the display panel 100 may be driven in the normal driving mode. For example, when the input image data represent a still image, the display panel may be driven in the low frequency driving mode. For example, when the display apparatus is operated in the always on mode, the display panel may be driven in the low frequency driving mode.

The display panel 100 may be driven in a unit of frame. The display panel 100 may be refreshed in every frame in the normal driving mode. Thus, the normal driving mode includes only writing frames in which the data is written in the pixel.

The display panel 100 may be refreshed in the frequency of the low frequency driving mode in the low frequency driving mode. Thus, the low frequency driving mode includes the writing frames in which the data is written in the pixel and holding frames in which the written data is maintained without writing the data in the pixel.

For example, when the frequency of the normal driving mode is 60 Hz and the frequency of the low frequency driving mode is 1 Hz, the low frequency driving mode includes one writing frame WRITE and fifty nine holding frames HOLD in a second. Herein, a length of the writing frame WRITE may be substantially the same as a length of the holding frame HOLD. For example, when the frequency of the normal driving mode is 60 Hz and the frequency of the low frequency driving mode is 1 Hz, fifty nine continuous holding frames HOLD are located between two adjacent writing frames WRITE.

For example, when the frequency of the normal driving mode is 60 Hz and the frequency of the low frequency driving mode is 10 Hz, the low frequency driving mode includes ten writing frame WRITE and fifty holding frames HOLD in a second. Herein, a length of the writing frame WRITE may be substantially the same as a length of the holding frame HOLD. For example, when the frequency of the normal driving mode is 60 Hz and the frequency of the low frequency driving mode is 10 Hz, five continuous holding frames HOLD are located between two adjacent writing frames WRITE.

According to some example embodiments, the second data write gate signal GWN and the data initialization gate signal GI may have a first frequency in the low frequency driving mode. The first frequency may be the frequency of the low frequency driving mode. In contrast, the first data write gate signal GWP, the emission signal EM and the organic light emitting element initialization gate signal GB may have a second frequency greater than the first frequency. The second frequency may be the normal frequency of the normal driving mode. In FIG. 12, for example, the first frequency is 1 Hz and the second frequency is 60 Hz.

The emission signal EM in the frame may include an emission off duration OD when the emission signal EM has the inactive level and an emission on duration when the emission signal EM has the active level.

When the touch event occurs on the display panel 100, the touch driver 600 detects the touch event. When the touch event occurs, a related-art touch driver may output the touch interrupt signal TINT and the touch coordinate signal TC only to the host 700. In contrast, when the touch event occurs, the touch driver 600 according to some example embodiments outputs the touch interrupt signal TINT to the host 700 and the driving controller 200.

According to some example embodiments, the driving controller receives the touch event from the touch driver 600 before receiving the touch event from the host 700 so that the driving controller 200 perceives the touch event only after the first delay DY1.

When the display panel 100 is driven in the low frequency driving mode and the touch event is perceived by the driving controller 200, the driving controller 200 drives the display panel 100 in the normal driving mode in a right next frame of a frame when the touch event is perceived.

According to some example embodiments, the driving controller 200 determines the driving frequency of the switching element of the first type to a first driving frequency (e.g. the normal driving frequency) and the driving frequency of the switching element of the second type to a second driving frequency (e.g. the low driving frequency) less than the first driving frequency in the low frequency driving mode.

The driving controller 200 determines the driving frequency of the switching element of the first type to the first driving frequency (e.g. the normal driving frequency) and the driving frequency of the switching element of the second type to the first driving frequency (e.g. the normal driving frequency) in the normal driving mode.

According to some example embodiments, the touch driver 600 directly outputs the touch interrupt signal TINT representing the occurrence of the touch event to the driving controller 200 so that the driving controller 200 may perceive the touch event immediately.

The driving controller 200 may determine the touch event immediately so that the display defect due to the delay of the image transition in the low frequency driving mode may be prevented or reduced. Therefore, the display quality of the display panel 100 may be enhanced.

According to some example embodiments of the display apparatus and the method of driving the display apparatus, the display quality in the low frequency driving mode may be enhanced.

The foregoing is illustrative of the present inventive concept and is not to be construed as limiting thereof. Although a few example embodiments of the present inventive concept have been described, those skilled in the art will readily appreciate that many modifications are possible in the example embodiments without materially departing from the novel teachings and characteristics of the present inventive concept. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of the present inventive concept and is not to be construed as limited to the specific example embodiments disclosed, and that modifications to the disclosed example embodiments, as well as other example embodiments, are intended to be included within the scope of the appended claims. The present inventive concept is defined by the following claims, with equivalents of the claims to be included therein.

What is claimed is:

1. A display apparatus comprising: a display panel configured to display an image based on input image data;
    a gate driver configured to output a gate signal to the display panel;
    a data driver configured to output a data voltage to the display panel;
    a driving controller configured to control an operation of the gate driver and an operation of the data driver, to determine a normal driving mode and a low frequency driving mode based on the input image data, and to determine a driving frequency of the display panel based on the input image data;
    a touch driver configured to detect a touch event occurring on the display panel, to output a touch interrupt signal representing the touch event to the driving controller, and to generate a touch coordinate signal representing a touch position; and
    a host configured to output the input image data to the driving controller and to receive the touch interrupt signal and the touch coordinate signal from the touch driver,
    wherein the touch driver is further configured to output the touch interrupt signal to both of the driving controller and the host, and wherein a timing of the touch interrupt signal is adjusted by a predetermined time delay such that the touch interrupt signal is simultaneously transmitted to the driving controller and the host.

2. The display apparatus of claim 1, wherein the driving controller is configured to perceive the touch event by the touch interrupt signal, and
    wherein when the display panel is driven in the low frequency driving mode and the driving controller perceives the touch event, the driving controller is configured to drive the display panel in the normal driving mode in a right next frame of a frame when the touch event is perceived.

3. The display apparatus of claim 1, wherein the driving controller comprises:
    a still image determiner configured to determine whether the input image data is a still image or a video image, and to generate a flag representing whether the input image data is the still image or the video image; and
    a driving frequency determiner configured to determine the normal driving mode and the low frequency driving mode based on the flag and to determine the driving frequency of the display panel based on a grayscale value of the input image data.

4. The display apparatus of claim 3, wherein the driving controller further comprises a flicker lookup table representing a degree of a flicker according to the grayscale value of the input image data, and
    wherein the driving frequency determiner is configured to determine the driving frequency of the display panel using the flicker lookup table.

5. The display apparatus of claim 1, wherein the driving controller includes an input port configured to receive the touch interrupt signal from the touch driver.

6. The display apparatus of claim 1, wherein the display panel comprises a switching element of a first type and a switching element of a-second type different from the first type.

7. The display apparatus of claim 6, wherein the driving controller is configured to determine a driving frequency of the switching element of the first type to a first driving frequency and a driving frequency of the switching element of the second type to a second driving frequency less than the first driving frequency in the low frequency driving mode, and
wherein the driving controller is configured to determine the driving frequency of the switching element of the first type to the first driving frequency and the driving frequency of the switching element of the second type to the first driving frequency in the normal driving mode.

8. The display apparatus of claim 6, wherein the switching element of the first type is a polysilicon thin film transistor, and
wherein the switching element of the second type is an oxide thin film transistor.

9. The display apparatus of claim 8, wherein the switching element of the first type is a P-type transistor, and
wherein the switching element of the second type is an N-type transistor.

10. A display apparatus comprising:
a display panel configured to display an image based on input image data;
a gate driver configured to output a gate signal to the display panel; a data driver configured to output a data voltage to the display panel;
a driving controller configured to control an operation of the gate driver and an operation of the data driver, to determine a normal driving mode and a low frequency driving mode based on the input image data, and to determine a driving frequency of the display panel based on the input image data;
a button controller configured to detect a button input event occurring at an input button, and to output a button interrupt signal representing the button input event to the driving controller; and
a host configured to output the input image data to the driving controller and to receive the button interrupt signal from the button controller, wherein the button controller is further configured to output the button interrupt signal to both of the driving controller and the host, wherein a timing of the button interrupt signal is adjusted by a predetermined time delay such that the button interrupt signal is simultaneously transmitted to the driving controller and the host.

11. The display apparatus of claim 10, wherein the driving controller is configured to perceive the button input event by the button interrupt signal, and
wherein when the display panel is driven in the low frequency driving mode and the driving controller perceives the button input event, the driving controller is configured to drive the display panel in the normal driving mode in a right next frame of a frame when the button input event is perceived.

12. A method of driving a display apparatus, the method comprising:
determining a normal driving mode and a low frequency driving mode based on input image data using a driving controller;
determining a driving frequency of a display panel based on the input image data using the driving controller;
outputting a gate signal to the display panel; outputting a data voltage to the display panel; detecting a touch event occurring on the display panel and outputting a touch interrupt signal representing the touch event to the driving controller using a touch driver;
outputting a touch coordinate signal representing a touch position and the touch interrupt signal to a host; and outputting the touch interrupt signal to both of the driving controller and the host, wherein a timing of the touch interrupt signal is adjusted by a predetermined time delay such that the touch interrupt signal is simultaneously transmitted to the driving controller and the host.

13. The method of claim 12, wherein the driving controller is configured to perceive the touch event by the touch interrupt signal, and
wherein when the display panel is driven in the low frequency driving mode and the driving controller perceives the touch event, the driving controller is configured to drive the display panel in the normal driving mode in a right next frame of a frame when the touch event is perceived.

14. The method of claim 12, wherein determining the normal driving mode and the low frequency driving mode comprises:
determining whether the input image data is a still image or a video image;
generating a flag representing whether the input image data is the still image or the video image; and
determining the normal driving mode and the low frequency driving mode based on the flag.

15. The method of claim 14, wherein the driving frequency of the display panel is determined based on a grayscale value of the input image data, and
wherein the driving frequency of the display panel is determined using a flicker lookup table representing a degree of a flicker according to the grayscale value of the input image data.

16. The method of claim 12, wherein the display panel comprises a switching element of a first type and a switching element of a second type different from the first type, and
wherein the driving controller is configured to determine a driving frequency of the switching element of the first type to a first driving frequency and a driving frequency of the switching element of the second type to a second driving frequency less than the first driving frequency in the low frequency driving mode, and
wherein the driving controller is configured to determine the driving frequency of the switching element of the first type to the first driving frequency and the driving frequency of the switching element of the second type to the first driving frequency in the normal driving mode.

* * * * *